United States Patent
Cook et al.

(10) Patent No.: US 10,121,847 B2
(45) Date of Patent: Nov. 6, 2018

(54) GALVANIC ISOLATION DEVICE

(71) Applicant: Texas Instruments Incorporated, Dallas, TX (US)

(72) Inventors: Benjamin Stassen Cook, Addison, TX (US); Barry Jon Male, West Granby, CT (US); Robert Alan Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/462,741

(22) Filed: Mar. 17, 2017

(65) Prior Publication Data

US 2018/0269272 A1    Sep. 20, 2018

(51) Int. Cl.
*H01L 23/495*    (2006.01)
*H01L 49/02*    (2006.01)
*H01L 23/66*    (2006.01)

(52) U.S. Cl.
CPC .......... *H01L 28/60* (2013.01); *H01L 23/4952* (2013.01); *H01L 23/49575* (2013.01); *H01L 23/66* (2013.01); *H01L 2223/6611* (2013.01)

(58) Field of Classification Search
CPC ................. H01L 27/108; H01L 27/115; H01L 27/10852; H01L 27/10894; H01L 27/10885; H01L 23/495; H01L 23/49589
See application file for complete search history.

(56) References Cited

U.S. PATENT DOCUMENTS

| | | |
|---|---|---|
| 3,508,126 A | 4/1970 | Newman |
| 3,952,265 A | 4/1976 | Hunsperger |
| 4,007,978 A | 2/1977 | Holton |
| 4,267,484 A | 5/1981 | O'Loughlin |

(Continued)

FOREIGN PATENT DOCUMENTS

| | | |
|---|---|---|
| EP | 1986297 A2 | 10/2008 |
| EP | 2490263 A2 | 8/2012 |

(Continued)

OTHER PUBLICATIONS

Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).

(Continued)

*Primary Examiner* — Quoc Hoang
(74) *Attorney, Agent, or Firm* — Michael A. Davis, Jr.; Charles A. Brill; Frank D. Cimino

(57) ABSTRACT

A galvanic isolation device includes a first integrated circuit (IC) die that has communication circuitry formed in a circuit layer below the top surface. A first conductive plate is formed on the IC die proximate the top surface, and is coupled to the communication circuitry. A dielectric isolation layer is formed over a portion of the top surface of the IC after the IC is fabricated such that the dielectric isolation layer completely covers the conductive plate. A second conductive plate is juxtaposed with the first conductive plate but separated by the dielectric isolation layer such that the first conductive plate and the second conductive plate form a capacitor. The second conductive plate is configured to be coupled to a second communication circuit.

15 Claims, 10 Drawing Sheets

(56) References Cited

U.S. PATENT DOCUMENTS

| | | | |
|---|---|---|---|
| 4,272,753 A | 6/1981 | Nicolay | |
| 4,891,730 A | 1/1990 | Saddow et al. | |
| 4,916,506 A | 4/1990 | Gagnon | |
| 4,996,577 A | 2/1991 | Kinzer | |
| 5,340,993 A | 8/1994 | Salina et al. | |
| 5,389,578 A | 2/1995 | Hodson et al. | |
| 5,514,892 A | 5/1996 | Countryman et al. | |
| 5,629,838 A * | 5/1997 | Knight | G01R 31/3025 257/E23.01 |
| 5,796,570 A | 8/1998 | Mekdhanasarn | |
| 5,929,514 A | 7/1999 | Yalamanchili | |
| 5,990,519 A | 11/1999 | Huang-Lu et al. | |
| 6,031,251 A | 2/2000 | Gempe et al. | |
| 6,242,987 B1 | 6/2001 | Schopf et al. | |
| 6,351,011 B1 | 2/2002 | Whitney et al. | |
| 6,365,433 B1 | 4/2002 | Hyoudo et al. | |
| 6,507,264 B1 | 1/2003 | Whitney | |
| 6,509,574 B2 | 1/2003 | Yuan et al. | |
| 6,815,808 B2 | 11/2004 | Hyodo et al. | |
| 6,821,822 B1 | 11/2004 | Sato | |
| 6,977,468 B1 | 12/2005 | Baginski | |
| 7,015,587 B1 | 3/2006 | Poddar | |
| 7,321,162 B1 | 1/2008 | Lee et al. | |
| 7,732,892 B2 | 6/2010 | Jeng et al. | |
| 7,842,542 B2 | 11/2010 | Shim et al. | |
| 7,869,180 B2 | 1/2011 | Cheung et al. | |
| 8,018,705 B2 | 9/2011 | Michalopoulos et al. | |
| 8,433,084 B2 | 4/2013 | Conti | |
| 8,436,460 B1 | 5/2013 | Gamboa et al. | |
| 8,569,082 B2 | 10/2013 | Kummerl et al. | |
| 8,633,551 B1 | 1/2014 | Teh et al. | |
| 9,184,012 B2 | 11/2015 | Wang | |
| 9,419,075 B1 | 8/2016 | Carothers et al. | |
| 9,748,207 B2 * | 8/2017 | Krause | H01L 25/0657 |
| 2003/0183916 A1 | 10/2003 | Heck et al. | |
| 2003/0222205 A1 | 12/2003 | Shoji | |
| 2004/0084729 A1 | 5/2004 | Leung et al. | |
| 2004/0111881 A1 | 6/2004 | Yang et al. | |
| 2005/0218300 A1 | 10/2005 | Quinones et al. | |
| 2006/0205106 A1 | 9/2006 | Fukuda | |
| 2007/0076421 A1 | 4/2007 | Kogo | |
| 2007/0229177 A1 | 10/2007 | Moriya | |
| 2008/0217759 A1 | 9/2008 | Lin et al. | |
| 2008/0266730 A1 | 10/2008 | Viborg et al. | |
| 2009/0052214 A1 | 2/2009 | Edo et al. | |
| 2009/0115049 A1 | 5/2009 | Shiraishi et al. | |
| 2010/0187652 A1 | 7/2010 | Yang | |
| 2010/0252923 A1 | 10/2010 | Watanabe et al. | |
| 2011/0089540 A1 | 4/2011 | Drost et al. | |
| 2011/0108747 A1 | 5/2011 | Liu | |
| 2011/0233790 A1 | 9/2011 | Bchir | |
| 2013/0134445 A1 | 5/2013 | Tarsa | |
| 2013/0194057 A1 | 8/2013 | Ruby | |
| 2013/0315533 A1 | 11/2013 | Tay et al. | |
| 2013/0320548 A1 | 12/2013 | Carpenter et al. | |
| 2013/0329324 A1 | 12/2013 | Tziviskos et al. | |
| 2014/0001632 A1 | 1/2014 | Uehling et al. | |
| 2014/0264905 A1 | 9/2014 | Lee et al. | |
| 2015/0035091 A1 | 2/2015 | Ziglioli | |
| 2015/0069537 A1 | 3/2015 | Lo et al. | |
| 2015/0249043 A1 | 9/2015 | Elian | |
| 2015/0255693 A1 | 9/2015 | Baade et al. | |
| 2015/0369681 A1 | 12/2015 | Imai | |
| 2015/0369682 A1 | 12/2015 | Nakajima | |
| 2015/0380353 A1 | 12/2015 | Bauer et al. | |
| 2016/0003436 A1 | 1/2016 | Singer | |
| 2016/0103082 A1 | 4/2016 | Kimura | |
| 2016/0167089 A1 | 6/2016 | Ng | |
| 2016/0209285 A1 | 7/2016 | Nakajima | |
| 2017/0089789 A1 | 3/2017 | Kanemoto | |
| 2017/0134004 A1 | 5/2017 | Isozaki | |
| 2017/0330841 A1 | 11/2017 | Cook et al. | |

FOREIGN PATENT DOCUMENTS

| | | |
|---|---|---|
| RU | 2169962 C2 | 6/2001 |
| RU | 2201017 C2 | 3/2003 |
| RU | 2263999 A | 7/2005 |

OTHER PUBLICATIONS

National Semiconductor Corporation, "Semiconductor Packaging Assembly Technology," National Semiconductor Corporation, Aug. 1999, pp. 1-8.
Cook, et al.: "Floating Die Package"; U.S. Appl. No. 15/248,151, filed Aug. 26, 2016; 34 pages.
Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).
Texas Instruments Product Brochure ISO7841x High-Performance, 8000-Vpk Reinforced Quad-Channel Digital Isolator, dated Nov. 2014 (37 pages).
Texas Instruments Application Report "The ISO72x Family of High-Speed Digital Isolators," SLLA198—Jan. 2006 (12 pages).
Texas Instruments Developers Guide "Digital Isolator Design Guide," SLLA284A, Jan. 2009 (19 pages).
Wikipedia article "3D Printing," retrieved from "http://en.wikipedia.org/w/index.php?title=3D_printing&oldid=624190184", dated Sep. 4, 2014 (35 pages).
OSRAM Opto Semiconductors GmbH, Oslon Compact (850nm), version 1.6, SFH 4710, dated Dec. 1, 2015 (13 pages).
International Search Report for PCT/US2017/031987 dated Sep. 7, 2017.
International Search Report for PCT/US2017/068983 dated May 17, 2018.
International Search Report for PCT/US2017/068997 dated May 24, 2018.

* cited by examiner

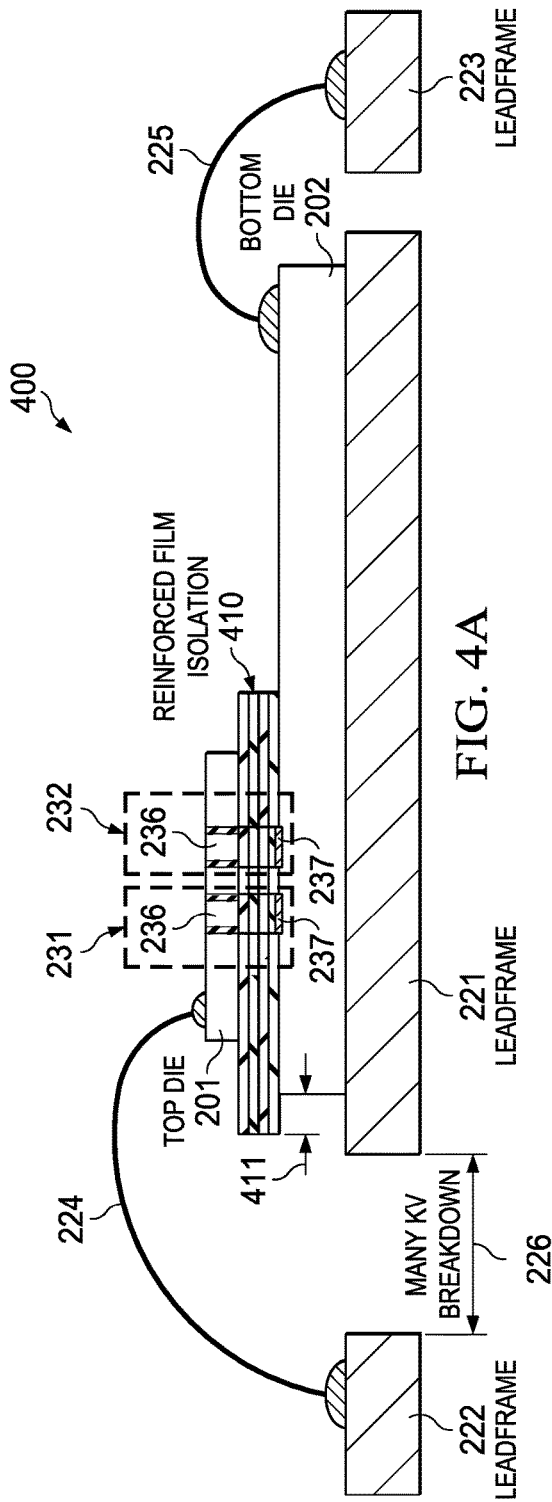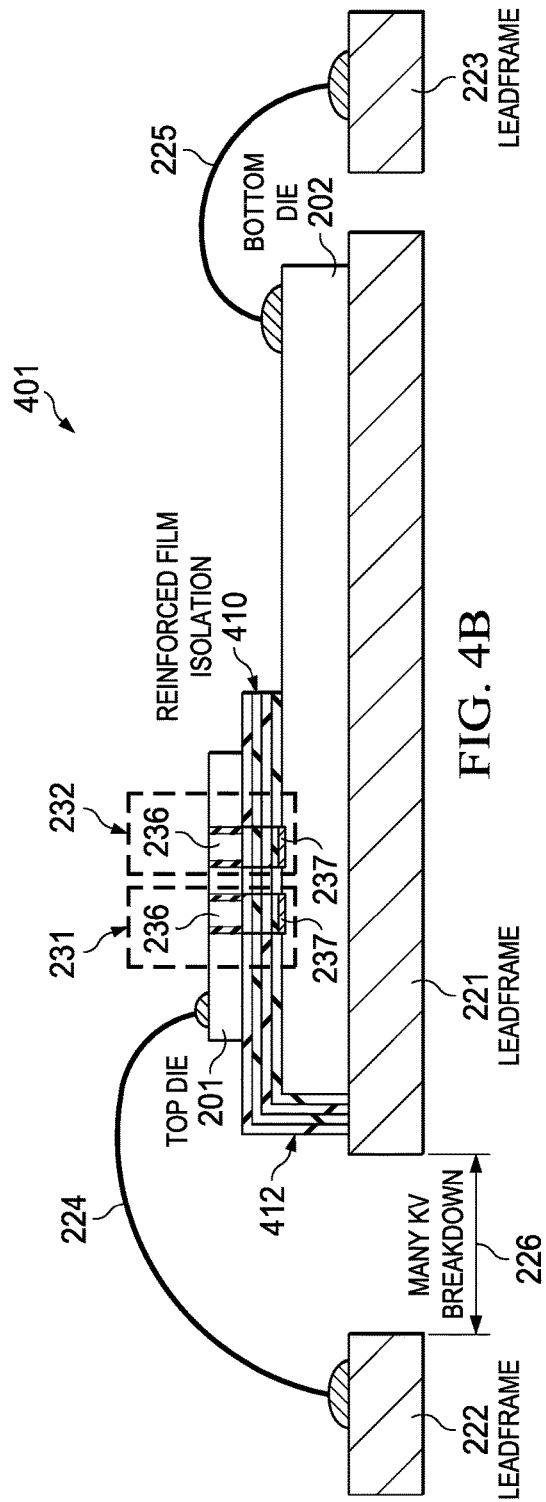

GALVANIC ISOLATION DEVICE

FIELD OF THE DISCLOSURE

This disclosure relates transmission of data in high voltage systems, and in particular to galvanic isolation devices used for the transmission of data.

BACKGROUND OF THE DISCLOSURE

Galvanic isolation is a principle of isolating functional sections of electrical systems to prevent current flow from one section to another. In order to prevent current flow, no direct conduction path is permitted. Energy or information can still be exchanged between the sections by other means, such as capacitance, induction or electromagnetic waves, or by optical, acoustic, or mechanical means.

Galvanic isolation may be used where two or more electric circuits must communicate, but their grounds may be at different potentials. It is an effective method of breaking ground loops by preventing unwanted current from flowing between two units sharing a ground conductor. Galvanic isolation is also used for safety, preventing accidental current from reaching ground through a person's body.

Integrated, capacitive-based, galvanic isolators allow information to be transmitted between nodes of a system at different voltage levels using a high voltage (HV) capacitive barrier along with a differential transmitter and receiver on either side of that barrier. The HV capacitors may be integrated as discrete capacitors, or combined within the transmitter and receiver integrated circuits. In the latter case, each integrated circuit (IC) has a HV capacitor constructed in the IMD (inter-metal dielectric) layers that form the top layers of each IC. HV capacitors are typically implemented on each IC within a single package and connected by bond wires to create a composite capacitor formed from two series capacitors elements. This redundancy provides an increased level of safety, because if one cap fails there is still a second capacitor to provide isolation.

BRIEF DESCRIPTION OF THE DRAWINGS

Particular embodiments in accordance with the disclosure will now be described, by way of example only, and with reference to the accompanying drawings:

FIGS. 4A-4B are cross sectional views illustrating alternative isolation layer embodiments;

Figure 1:
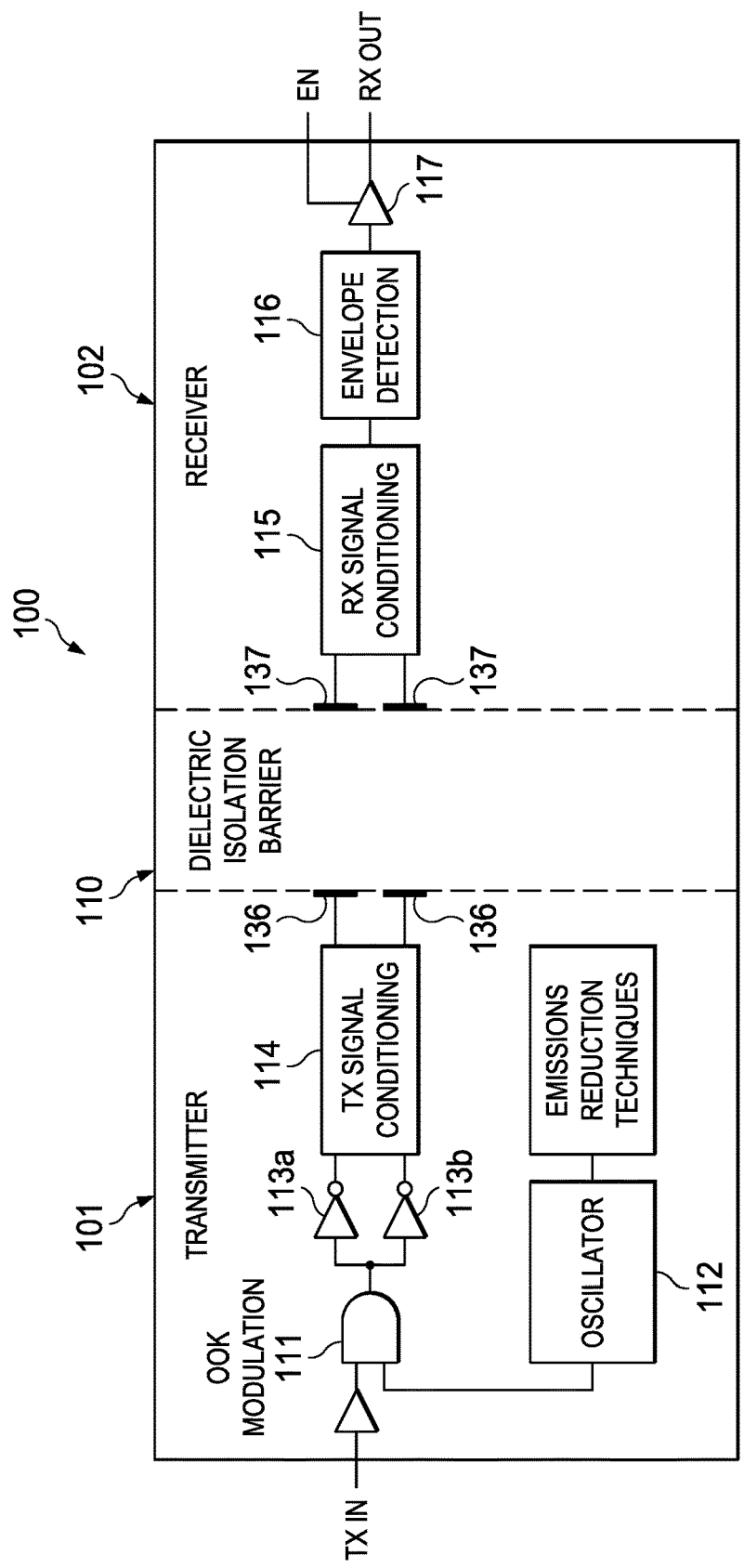
FIG. 1 is a conceptual block diagram of an example galvanic isolation device.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

In an embodiment of this disclosure, a transmitter integrated circuit (IC) die may be stacked on top of a receiver die that may also include additional application circuitry. The die attach material between the transmitter and the receiver may be a single or a multi-layer "re-enforced isolation" dielectric film. Multiple, dielectrically isolated capacitors may be formed between the two die using bottom plates formed in the top-layer metal under the passivation of the lower die and top plates that may be formed within an isolated semiconductor region on the top die or by a metallic conductive plate formed on the top die.

Galvanic isolation is a principle of isolating functional sections of electrical systems to prevent current flow from one section to another. In order to prevent current flow, no direct conduction path is permitted. Energy or information can still be exchanged between the sections by other means, such as capacitance, induction, or electromagnetic waves, or by optical, acoustic, or mechanical means. The general operation of capacitor based galvanic isolation devices is well known; see, for example, "Digital Isolator Design Guide," SLLA284A, revised November 2014, which is incorporated by reference herein. A quad-channel isolator that withstands 8 kv peak voltage is available from Texas Instruments; see, for example, "ISO7841x High-Performance, 8000-Vpk Reinforced Quad-Channel Digital Isolator," revised April 2016.

Capacitive coupling uses a changing electric field to transmit information across an isolation barrier. The material between the capacitor plates is a dielectric insulator and forms the isolation barrier. The plate size, distance between the plates, and the dielectric material determine the electrical properties.

A capacitive isolation barrier provides efficiency, in both size and energy transfer, and immunity to magnetic fields. The former enables low-power and cost-effective integrated isolation circuits. The latter enables operation in saturated or dense magnetic field environments.

Capacitive coupling does not pass steady-state signals and requires clock-encoded data. In a single sided capacitive coupling, unlike a transformer, there is no differential signal and noise and the signal may share the same transmission path. This requires that the signal frequencies be well above the expected frequency of noise so that the barrier capacitance presents low impedance to the signal and high impedance to the noise. A differential coupling topology may be used to provide improved noise rejection.

In previously available capacitor based galvanic isolation devices, the HV (high voltage) isolation capacitors may be implemented as discrete capacitors, or combined within the transmitter and receiver integrated circuits. In the latter case, each integrated circuit (IC) may have an HV capacitor constructed in the IMD (inter-metal dielectric) layers that form the top layers of each IC. HV capacitors are typically implemented on each IC within a single package and connected by bond wires to create a composite capacitor formed from two series capacitors elements. These HV capacitors may be fabricated using expensive process additions that may add up to seven layers of additional IMD and metal layers on top of each die in which a complete isolation capacitor is fabricated. This isolation extension process (ISO process) may only be offered on limited processes nodes available in a semiconductor foundry, and as such this may exclude the galvanic isolation feature on products that are taking advantage of the offerings of the latest technologies. This process node restriction drives some applications to incur the cost of three IC die in the isolation device package.

Thus, as base fabrication processes advance, isolation capabilities cannot follow process advances without incurring a significant development effort for each new process node. The number of die, lateral spacing to enable proper standoff voltage and bond wires may force larger package footprints than desired. In prior devices, each isolator die may be subjected to the full withstand voltage both laterally and vertically within the surface dielectrics of that die.

FIG. 1 is a conceptual block diagram of an example galvanic isolation device 100. This example device may use an ON-OFF Keying (OOK) modulation scheme to transmit digital data from a transmit input (TX in) port across a dielectric isolation barrier 110 using capacitive coupling with capacitor plates 136, 137 on each side of isolation barrier 110. A transmitter 101 may send a high-frequency carrier across barrier 110 to represent one digital state and may send no signal to represent the other digital state, for example. A receiver 102 demodulates the signal in detection circuit 116 after the signal passes through signal conditioning circuit 115 and produces a receiver output signal (RX out) through a buffer stage 117. In this example, output buffer 117 is a tri-state buffer; the output goes to high impedance when the EN pin is low.

Device 100 may also incorporate known or later developed circuit techniques to maximize common mode transient immunity (CMTI) performance and minimize radiated emissions produced by the high-frequency carrier and IO buffer switching. Transients may be a concern in capacitive coupling of signals. Differential transfer across the isolation barrier of the input single-ended logic signal allows the use of low-level signals and small coupling capacitance. The small coupling capacitance appears as high impedance to lower-frequency common-mode noise and with the common-mode noise rejection of the receiver provides transient immunity.

In this example, OOK modulator 111 may modulate the TX IN signal with the aid of a clock signal provided by oscillator 112 using known or later developed modulation techniques, for example. The modulated signal may then be provided to differential buffers 113a, 113b and then conditioned by conditioning circuitry 114 using known or later developed conditioning techniques to prepare the differential signals for capacitive coupling across dielectric isolate barrier 110.

In some embodiments, device 100 may use both a high-signaling rate and low-signaling rate channel to provide transfer of steady-state information. The high signaling-rate channel does not need to be encoded and it may transmit data transitions across the barrier after a single-ended-to-differential conversion. The low signaling-rate channel may encode the data in a pulse-width modulated format, for example, and transmit the data across the barrier differentially, ensuring the accurate communication of steady-state conditions such as a long string of 1s or 0s.

Figure 2A:
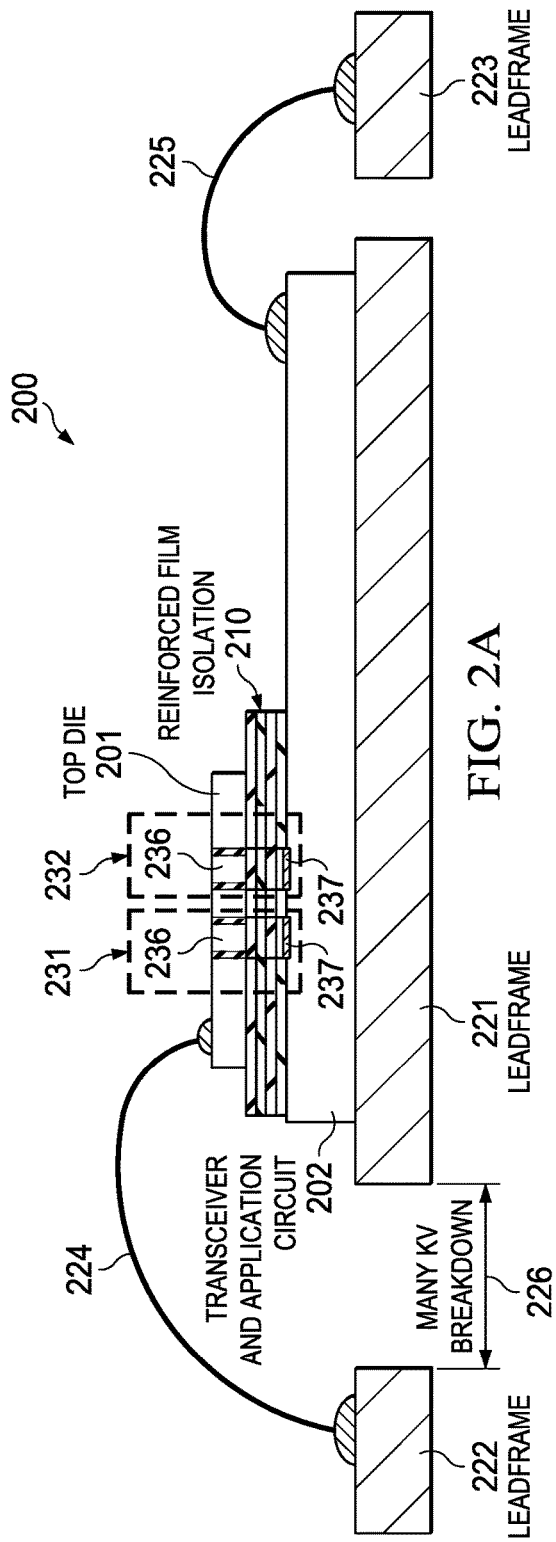
FIGS. 2A, 2B and 3 are views of an example galvanic isolation device embodied with two stacked integrated circuit dies.
Figure 2B:
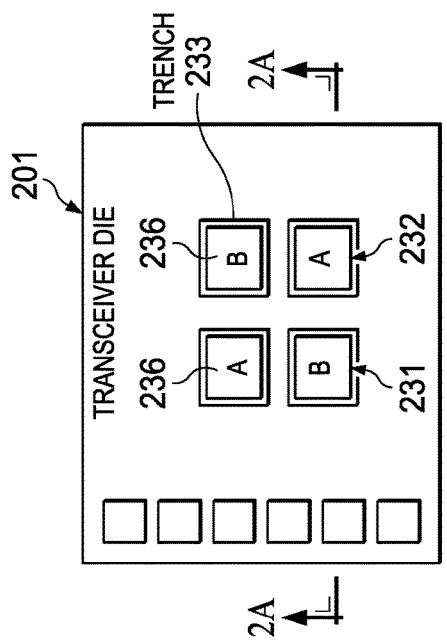

FIG. 2A is a cross sectional view of an example galvanic isolation device 200 embodied with two stacked back IC dies 201, 202 separated by a reinforced isolation film 210. FIG. 2B is a top view of the top die 201. Bottom die 202 may be mounted on a lead frame support pan 221. The lead frame may have a set of leads 222 that may be coupled to upper die 201 via bond wires 224, for example. In order to prevent voltage breakdown across the lead frame, a distance 226 between leads 222 and support pan 221 should be sufficient to prevent arcing of the maximum expected voltage specified for isolation device 200. The lead frame may also have a set of leads 223 that may be coupled to lower die 202 via bond wires 225, for example. Various configurations of lead frames are well known.

Bottom die 202 may include communication circuitry such as circuits 115-117 described in FIG. 1. The communication circuitry may be either a transmitter or a receiver, depending on the direction of signal flow across the isolation layer. Bottom die 202 may also include additional application circuitry for a particular application, as will be described in more detail later. Bottom die 202 also includes a set of capacitor plates 237 that may be formed in a top metal layer of die 202.

Top die 201 may include communication circuitry such as circuits 111-114 described in FIG. 1. The communication circuitry may be either a transmitter or a receiver, depending on the direction of signal flow across the isolation layer. Top die 201 may also include additional application circuitry for a particular application. Top die 201 also includes a set of capacitor plates 236 that are juxtaposed with the set of capacitor plates 237 in bottom die 202 but separated by dielectric isolation layer 210 to form a set of coupling capacitors 231,232 between top die 201 and bottom die 202.

In this example, the capacitor plates 236 in top die 201 are formed by highly doped semiconductor regions that are electrically isolated from the rest of top die 201 by dielectric filed trenches, such as indicated at 233. In this example, an array of four vertical capacitors 231, 232 is formed between the two die; two that are labeled "A" and two that are labeled "B." Diagonally positioned "A" capacitors may be interconnected and used for coupling one of the differential signals from die 201 to die 202 and the opposite diagonal positioned "B" capacitors may be interconnected and used for coupling the other differential signal from die 201 to die 202. Each pair of capacitors may be differentially driven and then differentially received with an interface circuit as described in more detail with regard to FIG. 1. Such diagonally connected arrays may be referred to as "common centroid arrays" and are commonly used to compensate for process differences across a region of a die. While an array of four capacitors is illustrated here, other embodiments may use larger cross-coupled arrays, while another embodiment may use only a single capacitor for each differential signal, for example.

Figure 3:
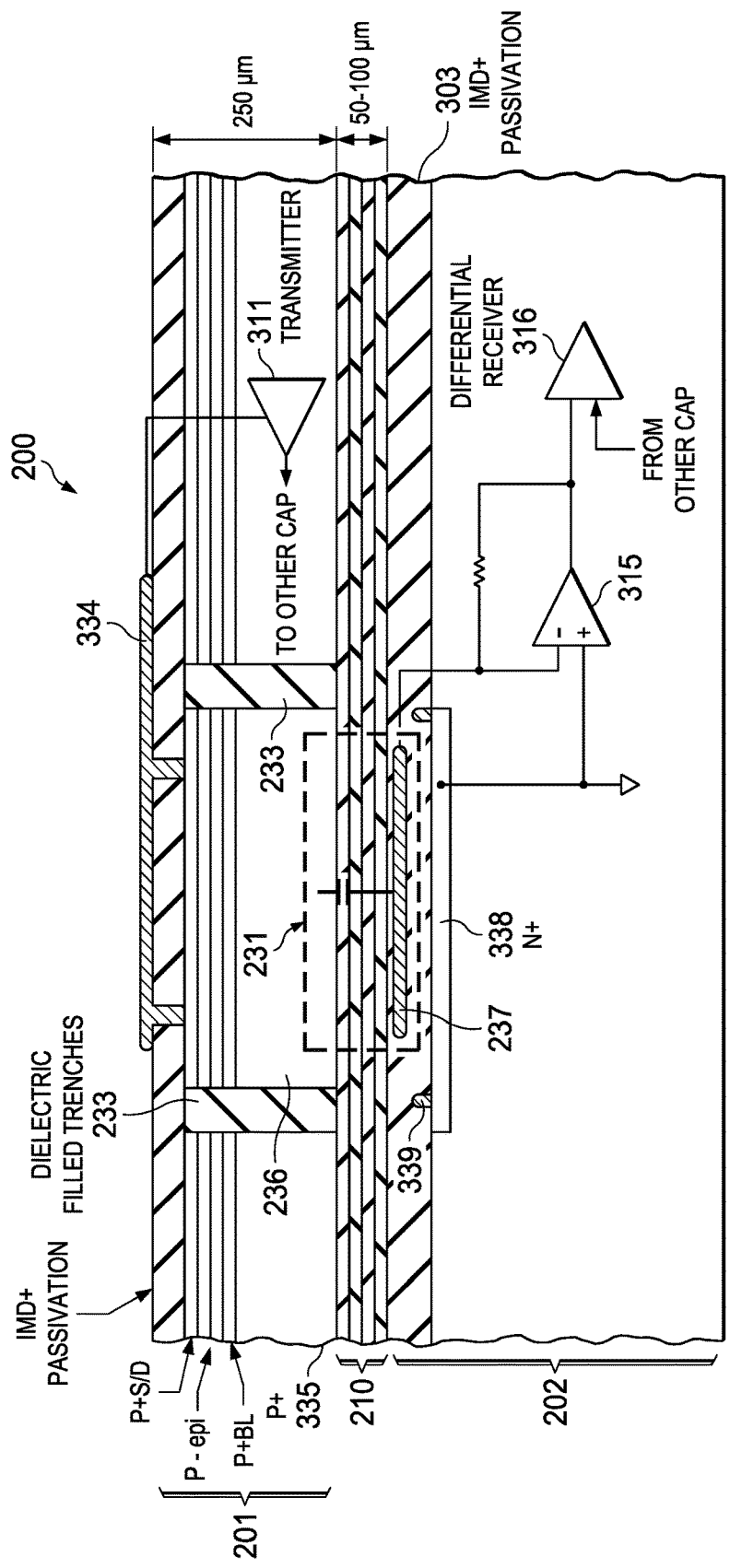

FIG. 3 is a more detailed cross sectional view of a portion of FIG. 2A that illustrates vertical capacitor 231 in more detail. Upper die 201 may include a number of various semiconductor layers, such as a heavily doped P+ substrate layer 335, a P+ doped buried layer (P+ BL), a lightly P doped epitaxial layer (P− epi), and a heavily doped P+ source/drain contact layer (P+ SD), for example. As will be explained in more detail below, a portion of P+ substrate layer 335 may be electrically isolated from the rest of layer 335 by dielectric filled trenches 233 to form a conductive plate 236. In this example, dielectric filled trenches 233 are approximately 50 um wide, for example. Conductive plate 236 may act as a top plate of vertical capacitor 231. An interconnect trace 334 may be patterned on a metal layer of die 201 to connect conductive plate 236 to communication circuitry 311. In this example, communication circuitry 311 is a transmitter with one output driving plate 236 of vertical capacitor 231 and an inverted output differentially driving vertical capacitor 232, referring again to FIG. 2A.

Additional semiconductor layers may be formed above P+ layer 335; these various layers may all be P doped to varying levels. The sequential stacking and composition of the various layers are unimportant to this disclosure. Each IC manufacturing process may use different stacks of materials, for example; sometimes with and sometimes without a P+ buried layer (BL). The only thing of significance in the layer stackup is that the bottom region 236 of top die 201 is the top plate of the capacitor and there has to be a way to connect to it from the surface metal trace 334 on top of the top die. If the bottom of the top die is P, then there needs to be a path through all P-doped silicon and metal between top metal 334 and conductive plate 236 of top die 201. There should not be an N-doped layer in-between, because that would form a diode.

In a typical IC process, the P+ S/D layer is commonly used as the source and drain of P-channel MOSFETs (metal oxide semiconductor field-effect transistor) and it is available for other uses, such as contacting the bottom of the wafer. These P-channel MOSFETs are typically built in N-well. In this example, the N-well may be either omitted from the process or masked (blocked) in the region of the vertical capacitors.

In this example, top die 201 may be approximately 10 mils thick or about 254 u thick; however, in other embodiments it may be thicker or thinner, for example, depending on the fabrication process. This example illustrates a P doped die 201. In another embodiment, the die may be N doped, for example. In either case, the conductive plate region 236 needs to be doped to a high enough level to be conductive.

Bottom die 202 may have a bottom plate 237 of vertical capacitor 231 formed in a top metal layer of die 202. Typically, a die may have several layers of metal for interconnect and power provisioning. Each metal layer may be separated from the next by an inter-metal dielectric (IMD) layer 303, which is typically silicon oxide, silicon nitride, or another insulating film, for example. A passivation layer is typically formed over the top metal layer for protection against corrosion.

Bottom plate 237 is connected to communication circuitry such as signal conditioning circuit 315 and differential receiver 316. Differential receiver 316 receives an inverted differential signal from the other vertical capacitor 232, referring back to FIG. 2A. A lateral shield 338 and vertical shield 339 may be grounded or connected to another voltage source, for example, to reduce emissions from vertical capacitor 231. Lateral shield 338 may be an N+ doped region, for example. Vertical shield 339 may be patterned from one or more metal layers, for example.

In this example, the communication circuitry includes a differential transmitter in top die 201 with an output connected to the top plate 236 of vertical capacitor 231 and a differential receiver in bottom die 201 with an input connected to the bottom plate 237 of vertical capacitor 231. In another embodiment, this arrangement may be reversed with a receiver in the top die and a transmitter in the bottom die, for example.

Dielectric isolation layer 210 may include several layers in order to provide redundancy and increased voltage breakdown protection. Dielectric isolation layer 210 may be formed by depositing one or more layers of film, such as traditional epoxy, prefabricated polymer sheet film, inkjet printed plastic, etc. Each layer may be applied as a liquid that hardens to allow additional layers to be added. Isolation layer 210 may also include a layer of adhesive so that it can also function as a die attach layer. For example, an adhesive layer may be applied as a liquid to either one of dies 201 or 202 that hardens after placement of the other die 201, 202.

In this embodiment, isolation layer 210 includes multiple layers to form a re-enforced dielectric isolation die attach film that is approximately 50 to 100 um thick. In some embodiments, isolation layer 210 may be configured to extend beyond an edge of bottom die 202.

In another embodiment, a top die may be fabricated in a similar configuration to bottom die 202 in which an array of top conductive plates is fabricated in a top metal layer of the top die. In this case, the top die may be flipped and then bonded to the dielectric isolation layer such that the array of top conductive plates is juxtaposed with the array of lower conductive plates to form vertical capacitors for coupling signals across the dielectric isolation layer. In this case, "through silicon vias" (TSV) may be used to connect communication circuitry in the top die to deposited metal bond pads on the backside of the top die, which is now the "new" top side of the top die.

In another embodiment, the top die may be in a normal orientation and TSVs may be used to connect to top conductive plates that are fabricated from a metal layer, or other conductive layer, that is deposited on the bottom side of the top die, for example.

FIGS. 4A-4B are cross sectional views illustrating examples of alternative isolation layer embodiments. In some embodiments, isolation layer 410 of device 400 may be extended beyond one or more edges of bottom die 202 as illustrated at 411 in FIG. 4A in order to provide enhanced voltage arcing protection. In this case, the film may be a prefabricated stack of dielectric layers that is then affixed to lower die 202, for example.

In some embodiments, isolation layer 410 of device 401 may be extended over and down one or more edges of bottom die 202 as illustrated at 412 in FIG. 4B in order to provide enhanced voltage arcing protection. In this case, isolation layer 410 may be applied as one or more layers using an inkjet printing technique, for example. Fabrication of three dimensional structures using ink jet printers or similar printers that can "print" various polymer materials is well known and need not be described in further detail herein. For example, see "3D printing," Wikipedia, Sep. 4, 2014. Printing allows for the rapid and low-cost deposition of thick dielectric and metallic layers, such as 0.1 um-1000 um thick, for example, while also allowing for fine feature sizes, such as 20 um feature sizes, for example.

In some embodiments, micro-drop deposition of dielectric material may be used to form one or more layers of isolation layer 410. Electrohydrodynamic jet printing may be used to perform micro-drop deposition, for example.

In some embodiments, isolation layer 410 may cover the entire top surface of bottom die 202. In this case, provisions would need to be made to provide openings at the bond pads of wire bonds 225.

In some embodiments, the isolation layer may include silicon, in the form of non-conductive silicon compounds, such as SiO2 or SiN (silicon nitride), or other materials used as IC passivation or materials used for the inter-metal dielectric.

In another embodiment, the isolation layer may include two or more individual layers of dielectric material with a metallic layer between two of the layers of dielectric material. In this case, the metallic layer acts as an intermediate capacitor plate and thereby each coupling capacitor (similar to 231) may act as two capacitors in series.

FIGS. 5A-5F are cross sectional views illustrating fabrication of an isolated semiconductor region, such as region 236 in FIG. 3. As discussed with regard to region 236, a portion of substrate 535 may be electrically isolated by dielectric filled trenches from the rest of substrate 535 to form a conductive plate for a vertical capacitor, such as plate 236 of vertical capacitor 231, as shown in FIG. 3. Various embodiments of isolated regions and methods for fabricating them are described in U.S. Pat. No. 9,419,075, "Wafer Substrate Removal," Dan Carothers et al, which is incorporated by reference herein. An example process for fabricating an isolated region will now be described herein.

Figure 5A:
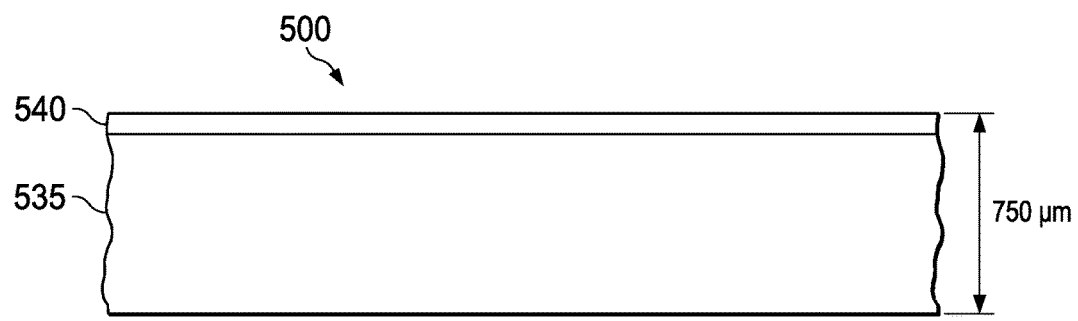
FIGS. 5A-5F are cross sectional views illustrating fabrication of an isolated semiconductor region.

Initially, a semiconductor wafer 500 may be fabricated as shown in FIG. 5A using known or later developed fabrication techniques. The wafer includes a substrate 535 and may include multiple layers on top of the substrate. For example, there may be an epitaxial (epi) layer 540 within which is fabricated various transistors to form circuitry, such as communication circuitry 311 as shown in FIG. 3. Additional metal, IMD, and passivation layers (not shown) may be fabricated on top of epi layer 540. In this example, the wafer is initially approximately 750 um thick.

Figure 5B:
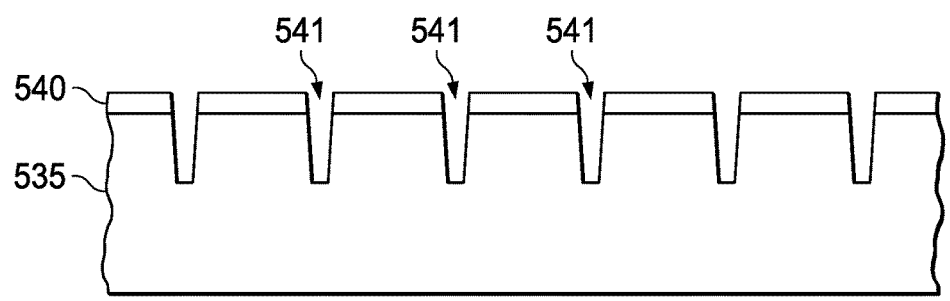
Figure 5C:
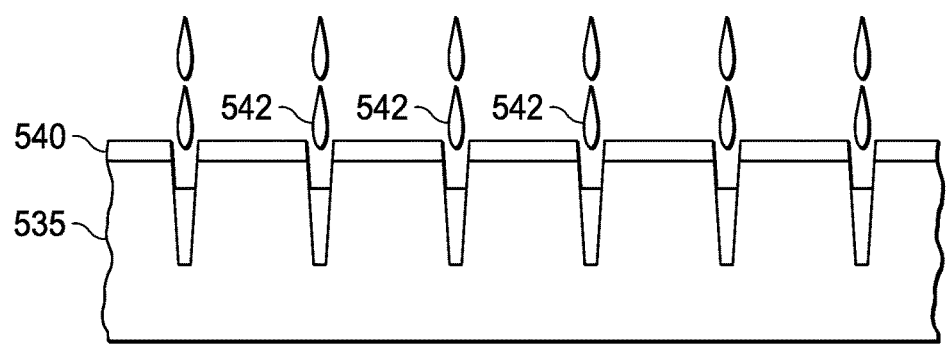
Figure 5D:
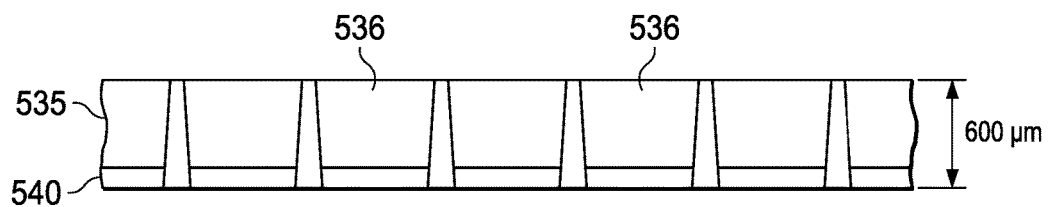

The wafer may then be patterned and etched to form deep trenches, such as indicated at 541 in FIG. 5B, using known or later developed etching technology. These trenches may from rectangular, square, circular, or other configurations, such as trench 233 as shown in FIG. 2B. These trenches need to be at least as deep as the final thickness of the wafer after grinding, but other than that the depth is not critical. In this example, the trenches may be approximately 50-100 um wide, for example.

The trenches are then filed with a suitable dielectric that can support the isolated regions after the wafer is background to its final thickness. In this embodiment, the trenches may be filed using an inkjet process as indicated at 542 in FIG. 5C.

After the trenches are filed, a back-grind operation may be performed using known or later developed grinding techniques to produce a wafer that is approximately 600 um thick in this embodiment. This causes the trenches to extend completely through substrate 635 and thereby form isolated regions as indicated at 536 in FIG. 5D. These regions may be similar to isolated regions 236 in FIG. 2B, for example.

Figure 5E:
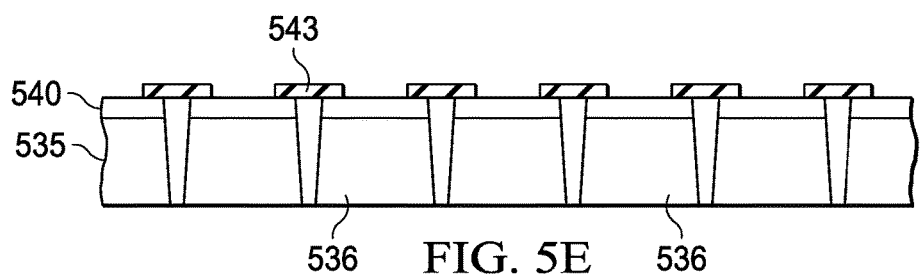

In some embodiments, one or more metal layers may be deposited, patterned and etched to form straps or metal interconnect traces that cross the trenches, as indicated at 543 in FIG. 5E. These may be used to form interconnects, such as interconnect 334 shown in FIG. 3.

Figure 5F:
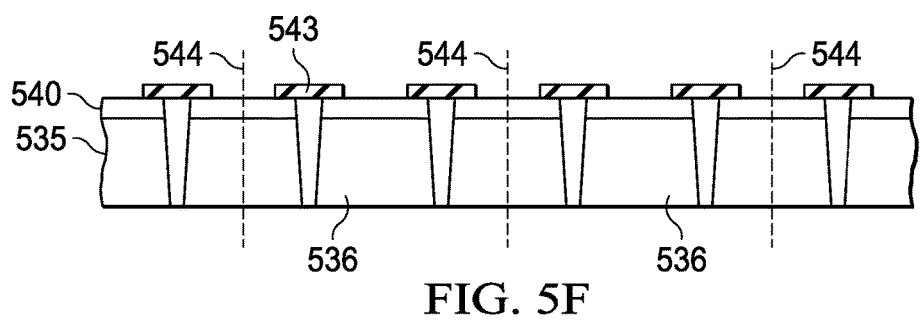

After wafer fabrication is complete, the wafer may be sawn or scribed to cingulate the dies from each other using known or later developed sawing or scribing techniques, as indicated at 544 in FIG. 5F.

Figure 6:
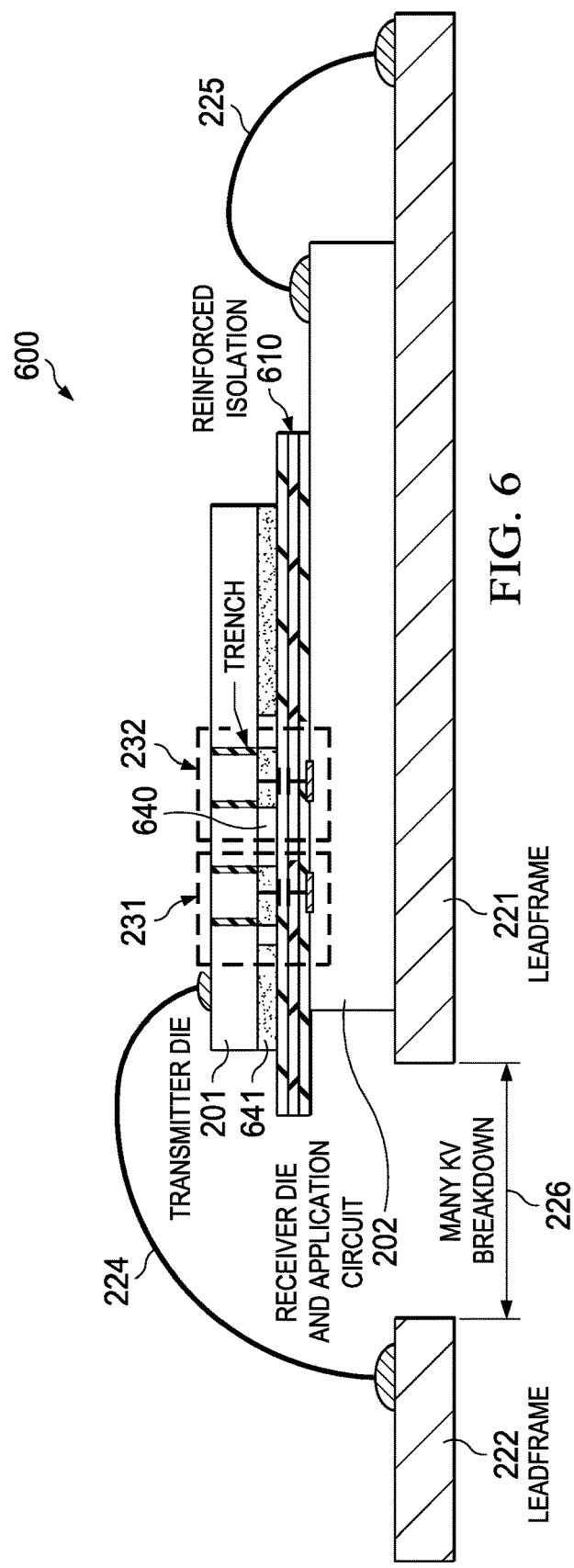
FIG. 6 is a cross sectional view of another example galvanic isolation device with air gaps.

FIG. 6 is a cross sectional view of another example galvanic isolation device 600 with air gaps 640. This device may be similar to device 200 of FIG. 2A, but with the addition of air gaps 640 to minimize undesirable lateral coupling between vertical capacitors 231-232. In this embodiment, air-dielectric gaps may be fabricated above isolation layer 610 by selective printing of die attach layer 641. Die attach layer 641 may be selectively printed using inkjet printing, for example. Alternatively, die attach layer 641 may be uniformly applied to a wafer and then patterned and etched using known or later developed semiconductor fabrication techniques.

Figure 7A:
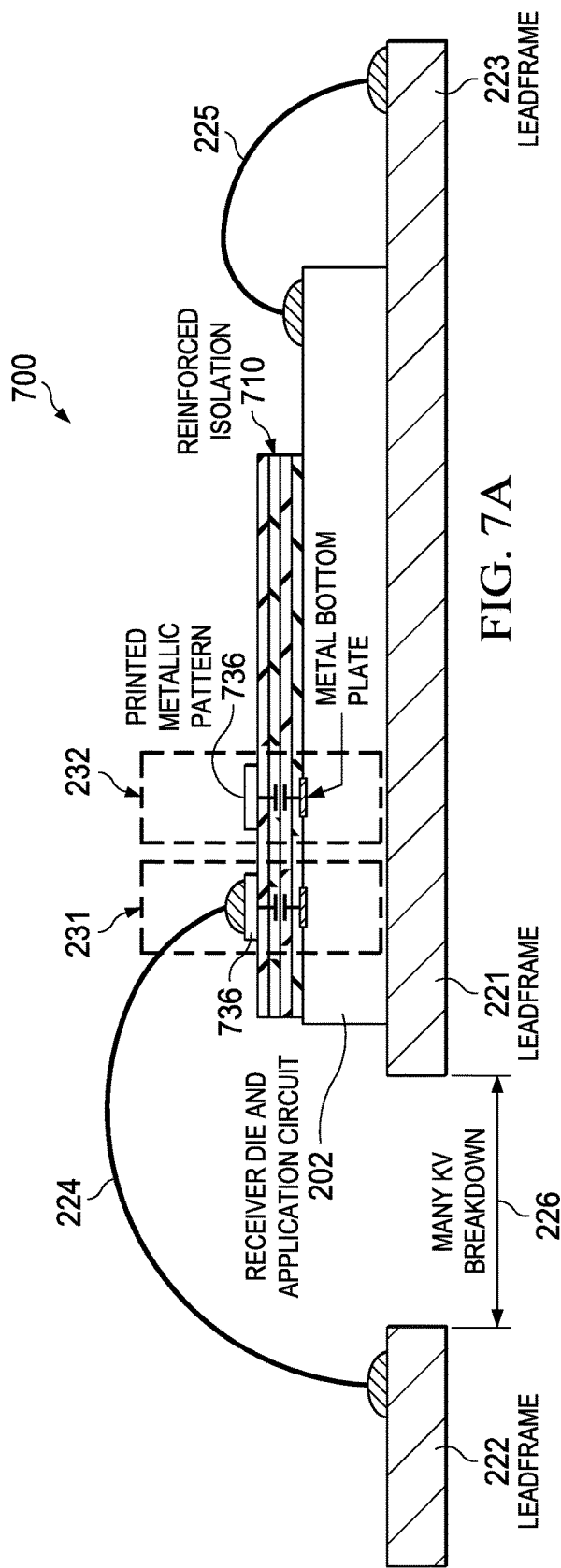
FIGS. 7A and 7B are a cross sectional view and a top view of another example galvanic isolation device embodied with a single IC die.
Figure 7B:
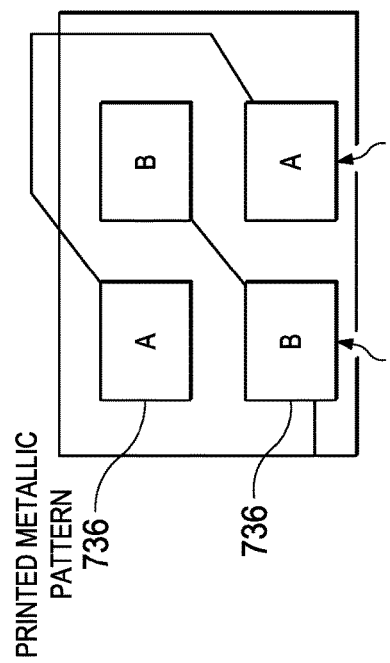

FIGS. 7A and 7B are a cross sectional view and a top view of another example galvanic isolation device 700 embodied with a single IC die. Dielectric isolation layer 710 may be a stack of N-layers of dielectric that are physically separate from the composite of the silicon die structure 202 beneath. The uppermost layer of dielectric stack 710 may have a printed conductive pattern 736 to form the top plates of vertical capacitors 231-232, as shown in FIG. 7B. In this case, an inkjet printing process may be used, for example. In this case, since a second die is not provided that contains communication circuitry, an external communication circuit may be use to provide a differential signal to couple through vertical capacitors 231, 232, for example.

Alternatively, upper plates 736 may be formed by a subtractive process where a conductive film is evaporated, sputtered, or otherwise deposited on the uppermost dielectric layer and then that layer is masked and etched. In such an approach, the dielectric and plate "assembly" may be mass produced and processed as an independent non-silicon sheet that is then diced and added to the lower die 202.

Figure 8:
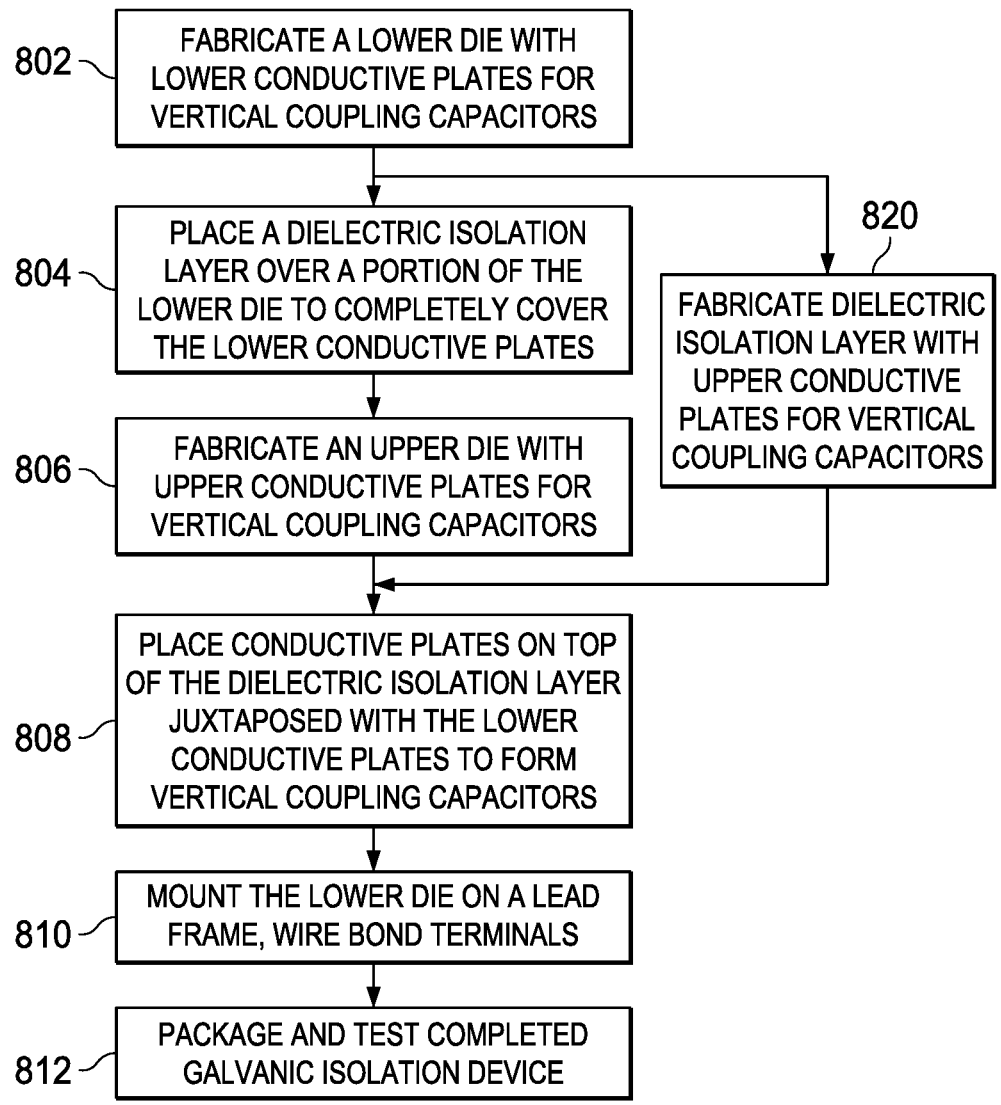
FIG. 8 is a flow chart illustrating fabrication of a galvanic isolation device.

FIG. 8 is a flow chart illustrating fabrication of a galvanic isolation device such as device 200 of FIG. 2A. As described above in more detail, an IC die (such as die 202 in FIG. 2A) may be fabricated as indicated at 802 to include an array of conductive plates in a top metal layer of the die. This IC die may be referred to as the "lower die" or "bottom die" because an "upper die" will be stacked on top of it. Each conductive plate will act as a lower plate of a vertical capacitor that may be used to couple signals produced by communication circuitry in the upper die to communication circuitry in the lower die, or vice versa. These conductive plates in the lower die may be referred to herein as "lower conductive plates."

The lower conductive plates do not necessarily need to be fabricated in a metal layer of the bottom die. For example, to take advantage of the layer(s) of oxide in the IMD as additional isolation insulation, the bottom lower conductive plates may be a heavy doped diffusion under the IMD and passivation.

A dielectric isolation layer, such as isolation layer 210 in FIG. 2A, may be placed over a portion of the lower die as indicated at 804 to completely cover the array of lower conductive plates. In some embodiments, the dielectric layer may extend beyond one or more edges of the lower die in order to provide additional voltage breakdown capability between the upper die and the lower die. The dielectric isolation layer may include several layers in order to provide redundancy and increased voltage breakdown protection. The dielectric isolation layer may be formed by depositing one or more layers of film, such as traditional epoxy, prefabricated polymer sheet film, inkjet printed plastic, etc. The isolation layer may also include a layer of adhesive so that it can also function as a die attach layer. In this embodiment, the isolation layer includes multiple layers to form a re-enforced dielectric isolation die attach film that is approximately 50 to 100 um thick.

As described above in more detail, an upper IC die (such as die 201 in FIG. 2A) may be fabricated as indicated at 806 to include an array of conductive plates fabricated in isolated semi-conductive regions in the substrate of the die. This IC die may be referred to as the "upper die" or "top die"

because it will be stacked on top of the lower die. Each conductive plate will act as an upper plate of the vertical capacitor that may be used to couple signals produced by communication circuitry in the upper die to communication circuitry in the lower die, or vice versa. These conductive plates in the upper die may be referred to herein as "upper conductive plates."

The upper die may then be stacked on top of the lower die as indicated at 808 such that the array of upper conductive plates is juxtaposed with the array of lower conductive plates, but separated by the dielectric isolation layer. As described above, the dielectric isolation layer may include a layer of "die attach" adhesive, or a die attach adhesive may be added at this time.

The stacked dies may then be mounted on a lead frame, such as lead frame 221 as shown in FIG. 2A, as indicated at 810. Wire bonding may then be performed to provide connections between bond pads on the upper die and the lead frame and between the lower die and the lead frame, as illustrated in FIG. 2A.

The finished assembly may then be packaged as indicated at 812 using known or later developed packaging techniques, such as encapsulation in mold compound to form a small outline integrated circuit (SOIC) package, a flat pack, a ball grid array, etc.

In another embodiment, a separate dielectric isolation layer, such as isolation layer 710 in FIG. 7A, may be fabricated to include an array of conductive plates arranged to align with the array of conductive plates in the bottom die as upper capacitor plates, as indicated at 820. The dielectric and plate "assembly" may be mass produced and processed as an independent non-silicon sheet that is then diced and added to the lower die 202, for example. In this case, the isolation layer indicated in 804 and the second die indicated in 806 are not needed.

In another embodiment, a dielectric isolation layer, such as isolation layer 710 in FIG. 7A, may be placed over a portion of the lower die as indicated at 804 to completely cover the array of lower conductive plates. In some embodiments, the dielectric layer may extend beyond one or more edges of the lower die in order to provide additional voltage breakdown capability between the upper die and the lower die. The dielectric isolation layer may include several layers in order to provide redundancy and increased voltage breakdown protection. The dielectric isolation layer may be formed by depositing one or more layers of film, such as traditional epoxy, prefabricated polymer sheet film, inkjet printed plastic, etc. The uppermost layer of this dielectric stack may have a printed conductive pattern, such as 736 in FIG. 7B, to form the top plates, as indicated at 808. In this case, an inkjet printing process may be used, for example. In this case, an upper die as indicated at 806 is not needed.

In another embodiment, the assembly flow may involve stacking from the bottom up. In this case, the lower die may be placed on the leadframe, the dielectric added, the top die added, followed by wirebonding and then package molding.

System Example

Figure 9:
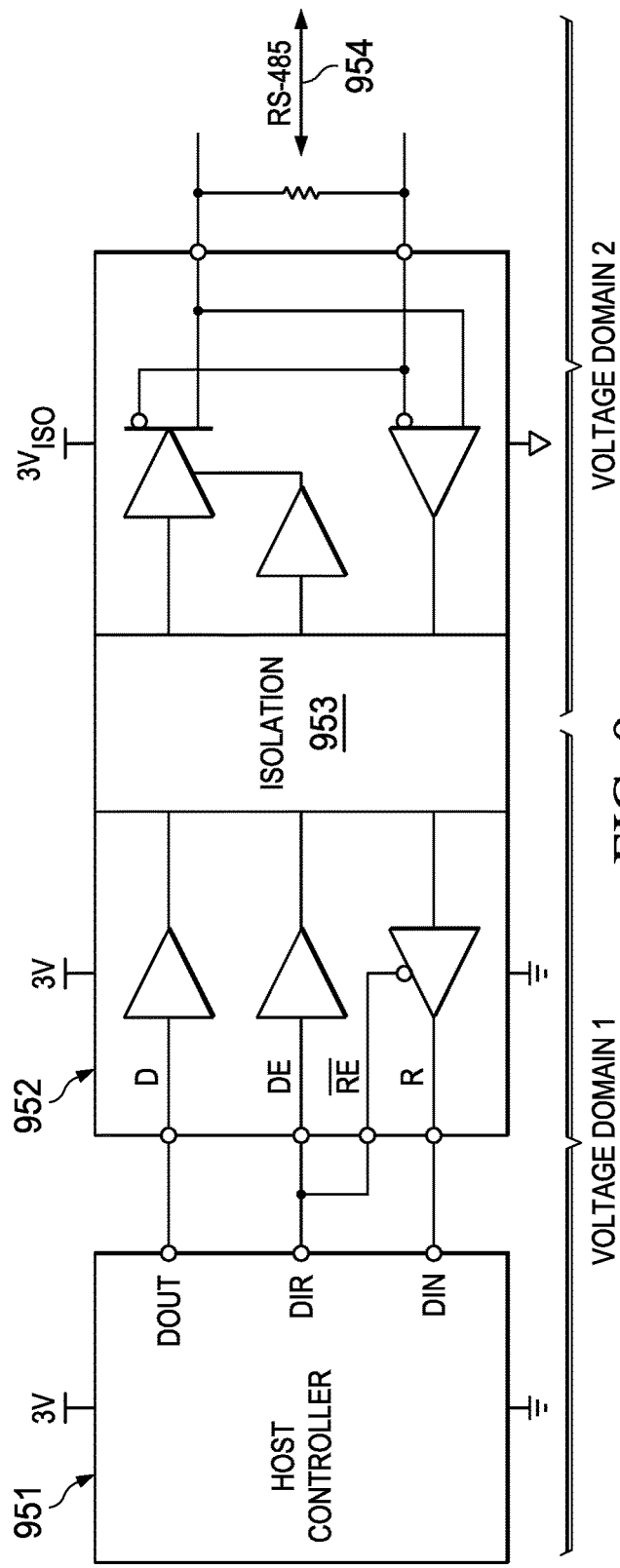
FIG. 9 is a block diagram of an example system that includes a galvanic isolation device.

FIG. 9 is a block diagram of an example system that includes a galvanic isolation device 953, such as described in more detail with reference to FIGS. 1-8. In this example, a system node 951 is operating in voltage domain 1. Node 951 may be any sort of system control node and may include a microcontroller, signal processor, computer system, etc. It may be a single IC, or it may be a large system. In other examples, node 951 may be a sensor device, a slave device, a master device, etc. that needs to communicate with a node in another voltage domain. Interface circuit 952 includes a galvanic isolation device 953 to provide galvanic isolation between voltage domain 1 and voltage domain 2. In this example, interface circuit 952 converts single ended data signals Din and Dout produced by, node 951 into differential RS-485 signals.

In this example, the entire interface circuit 952 may be operated in a low-voltage system. However, in a multi-node distributed RS-485 network, different nodes may be referenced to grounds at different potential, in which case isolation enables communication by level shifting between those ground potentials.

Due to the simplicity of the galvanic isolation device as described in more detail above, it is possible to integrate the isolator function 953 into the transceiver circuit 952, thus providing an application-specific isolator device featuring low-cost and low component count. Other example interface devices may produce an RS-232 interface, a Serial Peripheral Interface (SPI) bus, or any number of other known or later developed communication channels, for example.

A typical use for embodiments of this disclosure is to transmit data between two circuits at different voltages. This could be as simple as an on-off command, or more complex such as control parameters, measurement data, audio, video, file transfer, or any other data. Various applications may include communicating information for diverse isolation applications such as: multi-channel digital isolators, isolated gate drive, modulated analog for isolation amplifiers, modulated analog information for isolated secondary side feedback, isolated ADCs where the delta sigma modulator digital stream is sent over the isolation barrier, power delivery over an isolation barrier. All of these are communicating information digitally using mostly high frequency RF carrier frequencies.

Embodiments of this disclosure may provide safety isolation between two circuits. For example, one circuit could be a power controller connected to the power mains (120 VAC or 240 VAC) and the other could be a device with human interface (cell phone, tablet, game, computer terminal, etc.) In these uses, for safety reasons, standards organizations like UL require multiple insulating layers such that if one fails, the second is still intact to prevent electrocution. Typically, this is called "double insulation" or "reinforced isolation." In various embodiments, this disclosure intentionally uses multiple dielectric isolation layers to provide this extra margin of safety.

Embodiment of this disclosure enable reinforced safety isolation through the use of multiple film and surface IC oxide layers in combination with the use of cheap IC processes for the top and bottom IC dies. The breakdown voltage rating is scalable by simply increasing the thickness and/or dielectric characteristics of the dielectric isolation layer without needing any change to the top and bottom dies.

Thus, embodiments of the present invention may provide galvanic isolation using inexpensive film that may be applied between stacked IC dies during the assembly process of the isolation device. The IC dies that are used to embody the isolation device may be fabricated using essentially any semiconductor processing technology, based on what is best for customer applications. This may result in higher levels of feature integration. Vertical die placement may result in a smaller package size as compared to prior devices that used lateral die placement. Voltage stress is confined to the isolation layer film only and is not transferred to the upper or lower die circuitry. Voltage breakdown may be scaled by the isolation film thickness and number of layers.

Other Embodiments

While the disclosure has been described with reference to illustrative embodiments, this description is not intended to be construed in a limiting sense. Various other embodiments of the disclosure will be apparent to persons skilled in the art upon reference to this description. For example, appropriate scaling of the thickness, number of layers, and composition of the dielectric isolation layer between the upper and lower die may allow voltage breakdown ratings of several hundred volts, several kilovolts, up to a range of approximately 20 kv, for example.

In some embodiments, there may be a single communication channel provided as described herein. In other embodiments, there may be a pair of communication channels to provide two way communication. In other embodiments, there may be multiple communication channels on the same die.

As disclosed herein, two die may be stacked with a dielectric isolation layer between and vertical capacitors formed by a bottom plate in one of the dies and a top plate in the other die. Various semiconductor processes may be used to fabricated top and bottom dies that may be stacked in a typical upward facing orientation or in a flip-chip orientation, depending on where on each die a conductive layer is formed for the capacitor plate. The conductive plates may be formed in either an isolated semiconductor region or fabricated from metallic layers, for example.

In another embodiment, three or more dies may be stacked, with dielectric isolation layers between each pair. In this case, the middle dies may have conductive plates formed on both a top surface and a bottom surface of the die to form vertical coupling capacitors with adjacent stacked dies.

While silicon based IC die where discussed herein, other embodiments may be based on germanium, gallium arsenide, silicon carbide, allotropes of carbon such as graphene and other known or later developed semiconductor materials.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A galvanic isolation device comprising:
   a first integrated circuit (IC) die having a top surface, an opposite bottom surface, and a side surface therebetween;
   a first communication circuit formed in a circuit layer of the first IC die;
   a first conductive plate formed on the first IC die proximate the top surface, the first conductive plate being coupled to the first communication circuit;
   a dielectric isolation layer positioned on top of a portion of the top surface of the first IC die, such that the dielectric isolation layer completely covers the first conductive plate;
   a second conductive plate juxtaposed with the first conductive plate but separated from the first conductive plate by the dielectric isolation layer, such that the first conductive plate and the second conductive plate form a capacitor, the second conductive plate being arranged for coupling to a second communication circuit;
   a second IC die having a circuit layer in which the second communication circuit is formed; and
   a conductive isolated region formed in the second IC die such that the conductive isolated region is dielectrically isolated from the circuit layer of the second IC die;
   the second conductive plate being formed by the conductive isolated region of the second IC die and coupled to the second communication circuit.

2. The device of claim 1, in which the first communication circuit is an RF receiver having an input coupled to the first conductive plate.

3. The device of claim 1, in which the second communication circuit is an RF transmitter having an output coupled to the second conductive plate.

4. The device of claim 1, in which the dielectric isolation layer is arranged to withstand a voltage differential of at least 20 kv between the first conductive plate and the second conductive plate.

5. The device of claim 1, in which the dielectric isolation layer includes at least two insulating layers.

6. The device of claim 1, in which the dielectric isolation layer extends beyond a portion of the side surface of the first IC die and also extends beyond a portion of a side surface of the second IC die.

7. The device of claim 1, in which the first conductive plate is a metallic plate formed in a metal interconnect layer of the first IC die.

8. The device of claim 1, in which the dielectric isolation layer is a polymer film.

9. The device of claim 1, in which the dielectric isolation layer includes a non-conductive silicon compound.

10. The device of claim 1, in which the dielectric isolation layer includes a plurality of layers.

11. The device of claim 10, in which the dielectric isolation layer includes a metal layer between the plurality of layers.

12. A galvanic isolation device comprising:
    a first integrated circuit (IC) die having a top surface, an opposite bottom surface, and a side surface therebetween;
    first communication circuitry formed in a circuit layer of the first IC die;

first conductive plates formed on the first IC die proximate the top surface, the first conductive plates being coupled to the first communication circuitry;

a dielectric isolation layer positioned on top of a portion of the top surface of the first IC die, such that the dielectric isolation layer completely covers the first conductive plates;

second conductive plates juxtaposed with the first conductive plates but separated from the first conductive plates by the dielectric isolation layer, such that the first conductive plates and the second conductive plates form capacitors, the second conductive plates being arranged for coupling to second communication circuitry;

an attachment material selectively placed between the first die and a second IC die such that air gaps are formed between adjacent ones of the capacitors.

13. A galvanic isolation device comprising:
an integrated circuit (IC) die having a top surface, an opposite bottom surface, and a side surface therebetween;
a first communication circuit formed in a circuit layer of the IC die;
a first conductive plate formed on the IC die proximate the top surface, the first conductive plate being coupled to the first communication circuit;
a dielectric isolation layer positioned on top of a portion of the top surface of the IC die, such that the dielectric isolation layer completely covers the first conductive plate and also covers an end surface of the IC die; and
a second conductive plate juxtaposed with the first conductive plate but separated from the first conductive plate by the dielectric isolation layer, such that the first conductive plate and the second conductive plate form a capacitor, the second conductive plate being arranged for coupling to a second communication circuit.

14. A galvanic isolation device comprising:
an integrated circuit (IC) die having a top surface, an opposite bottom surface, and a side surface therebetween;
a first communication circuit formed in a circuit layer of the IC die;
a first conductive plate formed on the IC die proximate the top surface, the first conductive plate being coupled to the first communication circuit;
a dielectric isolation layer positioned on top of a portion of the top surface of the IC die, such that the dielectric isolation layer completely covers the first conductive plate and extends beyond a portion of the side surface of the IC die; and
a second conductive plate juxtaposed with the first conductive plate but separated from the first conductive plate by the dielectric isolation layer, such that the first conductive plate and the second conductive plate form a capacitor, the second conductive plate being arranged for coupling to a second communication circuit.

15. The device of claim 14, wherein the IC die is a first IC die, and the device further comprises:
a second IC die;
the second communication circuit being formed in a circuit layer of the second IC die; and
the second conductive plate being a metallic plate formed in a metal interconnect layer of the second IC die.

* * * * *